United States Patent [19]

Warren, Jr. et al.

[11] Patent Number: 4,933,204

[45] Date of Patent: Jun. 12, 1990

[54] METHOD OF PRODUCING A GOLD FILM

[75] Inventors: Leslie F. Warren, Jr., Camarillo; Patricia H. Cunningham, Thousand Oaks, both of Calif.

[73] Assignee: Rockwell International Corporation, El Segundo, Calif.

[21] Appl. No.: 248,223

[22] Filed: Sep. 23, 1988

[51] Int. Cl.$^5$ .................. B05D 3/06; B05D 5/12; C22B 11/00; C22B 3/00
[52] U.S. Cl. .................. 427/53.1; 427/125; 556/110
[58] Field of Search ................. 427/53.1, 125; 75/109, 75/118 R; 556/110

[56] References Cited

U.S. PATENT DOCUMENTS

| | | | |
|---|---|---|---|
| 3,458,476 | 7/1969 | Bayer | 75/118 R |
| 3,576,620 | 4/1971 | Wilson | 75/118 R |
| 3,778,252 | 12/1973 | Wilson | 75/109 |
| 4,484,992 | 11/1984 | Bühler et al. | 427/54.1 |
| 4,615,736 | 10/1986 | Armor et al. | 75/118 R |
| 4,714,627 | 12/1987 | Puddenphatt et al. | 427/53.1 |

OTHER PUBLICATIONS

Gross et al, Laser-Initiated Deposition Reactions: Microchemistry in Organogold Polymer Films, Applied Physics Letters 47 (9), 1 Nov. 1985.
Baum, Thomas H., Laser Chemical Vapor Deposition of Gold, Journal of the Electrochemical Society, 134, pp. 2616-2619 (1987).
Gross et al, A Chemical and Mechanistic View of Reaction Profiles in Laser Direct-Write Metallization in Metallo-Organic Films, Gold, Journal of Applied Physics, 60 (2), 15 Jul. 1986.
Fisanick et al, Laser-Initiated Microchemistry in Thin Films: Development of New Types of Periodic Structure, J. of Applied Physics, 57 (4), 15 Feb. 1985.
Gross et al, Laser Direct-Write Metallization in Thin Palladium Acetate Films, Journal of Applied Physics, 61 (4), 15 Feb. 1987.
Skapski et al, The Crystal Structure of Trimeric Palladium(II) Acetate, Chemical Communications, pp. 658-656, 1970.

*Primary Examiner*—Norman Morgenstern
*Assistant Examiner*—Marianne L. Padgett
*Attorney, Agent, or Firm*—Craig O. Malin; John C. McFarren; H. Fredrick Hamann

[57] ABSTRACT

A gold(III) acetate is formed by dissolving gold(III) hydroxide in glacial acetic acid. This solution containing gold(III) acetate can be used to form a gold-containing film by heating it above about 60° C. and then casting it to form a film. Gold can be deposited from the film by heating it to about 175° C. to decompose the film. In this manner, a line or pattern of conductive gold can be formed by heating selected portions of the film with a laser.

7 Claims, No Drawings

METHOD OF PRODUCING A GOLD FILM

BACKGROUND OF THE INVENTION

This invention is concerned with compounds of gold, and particularly a gold(III) acetate, a method of making gold(III) acetate, and a use for gold(III) acetate.

Gold compounds have been used in printing and for depositing conductive gold lines in microelectronic circuits. For example, M. E. Gross, et al. describe, in "Laser-initiated deposition reactions: Microchemistry in organogold polymer films," Appl. Phys. Lett., Vol. 47, No. 9, pp. 923-925 (Nov. 1, 1985), a bright gold screen ink consisting of a mixture of gold(III) chloride reacted with sulfurized terpenes, resin binders, essential oils, and base metal brightening agents. A quartz substrate coated with this ink has been exposed to the output of a laser to produce micron-sized gold features by decomposition of the exposed film.

In U.S. Pat. No. 4,714,627, Richard J. Puddephatt, et al. describe a method of depositing gold using volatile organogold complexes. These complexes are described in gold with alkyl, alkenyl, alkynyl, aryl, or aralkyl groups. The complexes are vaporized in a vacuum and gold is deposited by decomposition of the vapor on the hot surface of the target.

In "Laser Chemical Vapor Deposition of Gold," J. Electrochem. Soc., Vol. 134, No. 10, pp. 2616-19 (October 1987), Thomas H. Baum describes the laser-induced pyrolytic deposition of gold from dimethylgold acetylacetonate and from two fluorinated derivatives.

Conductive gold is widely used in microelectronic circuits and there is a continuing need for new gold compounds and methods of using these compounds to provide different capabilities for using gold in the fabrication of such circuits.

SUMMARY OF THE INVENTION

It is an object of the invention to provide a new gold compound.

It is an object of the invention to provide a method of making a gold compound.

It is an object of the invention to provide a method of producing a gold containing film.

It is an object of the invention to provide a method of depositing gold features on a substrate.

According to the invention, gold(III) hydroxide is dissolved in glacial acetic acid to produce gold(III) acetate having the formula:

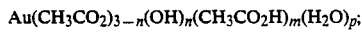

where:
n is an integer 0, 1, or 2, and
m and p are positive integers.

A film containing the gold(III) acetate is formed by heating the solution of gold(III) hydroxide and glacial acetic acid to about 60° centigrade and then casting a film with the heated solution.

Gold features such as conducting lines in a microcircuit can be formed by casting the gold(III) acetate film on a suitable substrate such as silicon, and then traversing the film with a laser in the locations where it is desired to produce the conducting lines. The laser should be operated at a power and speed sufficient to heat the traversed locations to a temperature above about 175° C.

These and other objects and features of the invention will be apparent from the following detailed description.

DESCRIPTION OF THE INVENTION

It has been discovered that gold(III) hydroxide will dissolve in glacial acetic acid to form a dark reddish solution. Casting films of this solution (heated to about 60° C.) results in clear, amorphous films of an "acetate" reagent. It appears, from a study of the reactants and the possible products, that the film is a gold(III) acetate having the following formula:

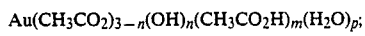

where:
n is an integer 0, 1, or 2, and
m and p are positive integers.

The film can be converted to gold by heating it to a temperature above about 175° C.

Examples of methods used to form the gold(III) acetate film and a gold deposit from the film are given below. The gold(III) hydroxide used in these examples was made by heating $HAuCl_4$ in aqueous $Na_2CO_3$ at a pH of 8 for three hours, filtering, rinsing with water, and storing in a freezer. The freezing process converted the precipitate to a granular form, which was further rinsed with water and partially air-dried.

EXAMPLE 1

0.72 g of moist gold(III) hydroxide (about 2 mmoles) was dissolved in 3.28 g of glacial acetic acid (about 55 mmoles) by warming at 60° C. to form a solution having a concentration of 0.6M in gold(III) acetate. The resulting dark reddish brown solution was dripped (or in some cases spin-coated) onto a glass substrate to form a clear, amorphous film of the "acetate" compound after evaporation of the solvent.

EXAMPLE 2

A film prepared as described in Example 1 was heated in an oven at 177° C. This gave a reflecting but non-conducting film of metallic gold. Microscopic examination showed this surface film to be granular and non-coherent.

EXAMPLE 3

A film prepared as described in Example 1 was heated in an oven at 260° C. This gave a highly conducting gold film, yellow by reflection and blue by transmission.

EXAMPLE 4

A film was prepared as described in Example 1 except that an alumina substrate was used. This film was then traversed with a laser beam to form a line of gold on the substrate, and washed with a solvent (methanol) to remove unreacted acetate film. Both a carbon dioxide laser and an argon laser were used at various combinations of laser slew rate, beam size, length of deposit, and repetition of exposure. Some combinations gave non-conductive lines that could be removed with a cotton swab and methanol wash. Other combinations gave conductive lines with good adhesion. A combination which provided an adherent, gold line with a conductivity of 8 to 10 ohms was: an argon laser (514 nm), spaced 9 inches from a 7" focal length focusing lens, at a power of 0.25 watts, and for a single traverse at a speed of 20 micrometers per second. Based upon the results of oven heating in Examples 2 and 3, it is concluded that the non-conductive lines were formed by a laser which heated the line of film to an effective temperature in the range of at least about 177° to 260° C., whereas the conductive lines were formed by lasers which heated the line of film to an effective temperature over 260° C.

The preferred embodiments of this invention have been illustrated by the examples described above. Modifications and additional embodiments, however, will undoubtedly be apparent to those skilled in the art, in particular to enhance adhesion. Furthermore, equivalent elements may be substituted for those illustrated and described herein, and certain features of the invention may be utilized independently of other features. Consequently, the exemplary embodiments should be considered illustrative, rather than inclusive, while the appended claims are more indicative of the full scope of the invention.

What is claimed is:

1. A method of producing a gold-containing film, comprising the steps of:
   dissolving gold(III) hydroxide in glacial acetic acid heated to a temperature of about 60° C.; and
   casting an amorphous film of the heated solution of gold(III) hydroxide and glacial acetic acid.

2. A method of producing a film of gold, comprising the steps of:
   dissolving gold(III) hydroxide in glacial acetic acid heated to a temperature of about 60° C.;
   casting an amorphous film of the heated solution of gold(III) hydroxide and glacial acetic acid; and
   heating the film to a temperature of at least about 177° C.

3. The method of claim 2, further comprising the step of heating the film to a temperature in the range of about 177° to 260° C., thereby producing a non-coherent film with low conductivity.

4. The method of claim 2, further comprising the step of heating the film to a temperature of at least about 260° C., thereby producing a coherent and highly conductive gold film.

5. A method of producing a line of gold on a substrate, comprising the steps of:
   preparing precipitated hydrous gold(III) hydroxide;
   dissolving the gold(III) hydroxide in glacial acetic acid, thereby producing a solution of gold(III) acetate in glacial acetic acid solvent;
   heating the solution of gold(III) acetate to a temperature of about 60° C.;
   casting the heated solution of gold(III) acetate onto a substrate;
   evaporating excess solvent to form an amorphous film of gold(III) acetate on the substrate; and
   traversing a line on the film with a laser beam to heat the film to a temperature of at least about 177° C. along the line.

6. The method of claim 5, wherein the step of heating the film with a laser beam comprises heating the film to a temperature of at least about 260° C., thereby forming a coherent and highly conductive line of gold on the substrate.

7. The method of claim 6, further comprising the step of washing the film with solvent to remove the unheated gold(III) acetate film, thereby leaving only the line of gold on the substrate.

* * * * *